United States Patent
Cho et al.

(10) Patent No.: US 11,659,672 B2
(45) Date of Patent: May 23, 2023

(54) CURVATURE VARIABLE DISPLAY DEVICE

(71) Applicant: LG Display Co., Ltd., Seoul (KR)

(72) Inventors: SeokHyo Cho, Gyeonggi-do (KR); JaeHo Kim, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 111 days.

(21) Appl. No.: 17/492,345

(22) Filed: Oct. 1, 2021

(65) Prior Publication Data
US 2022/0201883 A1   Jun. 23, 2022

(30) Foreign Application Priority Data
Dec. 23, 2020  (KR) .......................... 10-2020-0182032

(51) Int. Cl.
*H05K 5/02*   (2006.01)
*H05K 5/00*   (2006.01)

(52) U.S. Cl.
CPC ......... *H05K 5/0226* (2013.01); *H05K 5/0017* (2013.01); *H05K 5/0234* (2013.01)

(58) Field of Classification Search
CPC ....... G09F 9/301; G09F 9/302; H05K 5/0226; H05K 5/0017; H05K 5/0234; H05K 5/0018; G06F 1/1652
See application file for complete search history.

(56) References Cited

U.S. PATENT DOCUMENTS

| | | | |
|---|---|---|---|
| 7,883,069 B2* | 2/2011 | Park | A47G 1/18 248/328 |
| 9,081,540 B1* | 7/2015 | Cho | G06F 1/1601 |
| 9,119,298 B2* | 8/2015 | Park | G06F 1/1601 |
| 9,123,290 B1* | 9/2015 | Cho | G06F 1/1652 |
| 9,307,658 B2* | 4/2016 | Song | F16M 11/00 |
| 9,510,440 B2* | 11/2016 | Nam | G06F 1/1652 |
| 9,524,660 B2* | 12/2016 | Lee | G09F 9/301 |
| 9,727,080 B2* | 8/2017 | Jung | G06F 1/1652 |
| 9,829,069 B2* | 11/2017 | Park | H04N 5/64 |
| 9,843,758 B2* | 12/2017 | Park | G09G 3/20 |
| 9,947,263 B2* | 4/2018 | Kim | G09G 3/2096 |
| 10,194,540 B2* | 1/2019 | Sun | H10K 77/111 |
| 10,484,642 B2* | 11/2019 | Park | G09G 3/3216 |
| 10,645,828 B2* | 5/2020 | Kim | H05K 5/0234 |
| 11,229,127 B2* | 1/2022 | Hwang | G06F 1/1652 |
| 11,567,546 B2* | 1/2023 | Kim | G06F 1/181 |

(Continued)

*Primary Examiner* — Rockshana D Chowdhury
*Assistant Examiner* — Douglas R Burtner
(74) *Attorney, Agent, or Firm* — Birch, Stewart, Kolasch & Birch, LLP

(57) ABSTRACT

Provided is a curvature variable display device including a panel assembly including a display panel, a back plate disposed on a rear surface of the panel assembly, a first side bracket and a second side bracket respectively coupled to two sides of a rear surface of the back plate, a bending plate having one end rotatably coupled to the first side bracket and another end rotatably coupled to the second side bracket and having a convex curvature toward a rear of the back plate, a stand post having an upper end coupled to a center area of the bending plate and a lower end coupled to a stand base, and a dial assembly provided on the stand base to wind or unwind a wire coupled to the rear surface of the back plate and change curvatures of the panel assembly and the back plate.

20 Claims, 15 Drawing Sheets

(56) References Cited

U.S. PATENT DOCUMENTS

| | | | |
|---|---|---|---|
| 2005/0040962 A1* | 2/2005 | Funkhouser | G09F 9/301 340/815.4 |
| 2011/0116218 A1* | 5/2011 | Choi | H05K 5/0234 361/679.01 |
| 2014/0132935 A1* | 5/2014 | Kim | G03B 21/56 353/79 |
| 2014/0198465 A1* | 7/2014 | Park | G09F 9/00 361/749 |
| 2014/0354519 A1* | 12/2014 | Lee | G09F 9/301 345/76 |
| 2015/0009635 A1* | 1/2015 | Kang | G09F 19/02 361/749 |
| 2015/0029166 A1* | 1/2015 | Park | G06F 1/1641 345/184 |
| 2015/0043136 A1* | 2/2015 | Kim | H02P 31/00 361/679.01 |
| 2015/0117009 A1* | 4/2015 | Liu | G09F 9/301 362/249.03 |
| 2015/0145837 A1* | 5/2015 | Park | G06F 1/16 345/184 |
| 2015/0366090 A1* | 12/2015 | You | G06F 1/166 248/686 |
| 2016/0044806 A1* | 2/2016 | Park | G02F 1/133308 361/679.01 |
| 2017/0188470 A1* | 6/2017 | Cho | G09F 9/301 |
| 2019/0129234 A1* | 5/2019 | Eom | G06F 1/1601 |
| 2021/0141587 A1* | 5/2021 | Cho | G06F 3/16 |
| 2021/0168955 A1* | 6/2021 | Jeon | H10K 50/84 |
| 2022/0019271 A1* | 1/2022 | Kim | G09F 9/301 |

* cited by examiner

CURVATURE VARIABLE DISPLAY DEVICE

CROSS REFERENCE TO RELATED APPLICATION

This application claims priority to Korean Patent Application No. 10-2020-0182032, filed on Dec. 23, 2020 in the Republic of Korea, the entire contents of which are hereby expressly incorporated by reference for all purposes as if fully set forth herein into the present application.

BACKGROUND

Field

Embodiments of the present disclosure relate to a curvature variable display device.

Description of Related Art

In general, a liquid crystal display (LCD) device, a plasma display device, a field emission display device, and a light emitting display device, and so on are under active study as flat display devices. Among them, the LCD device and the light emitting display device have attracted much interest due to their benefits of mass production, ease of driving means, and realization of high image quality.

Along with research efforts to overcome the technical shortcomings of these flat panel display devices, the necessity of research and development is particularly highlighted in terms of design of display products which are more appealing to users. Accordingly, the demand for a curved display device having a curvature in the display device is gradually increasing.

In addition, the curved display device has been developed in such a way that a predetermined curvature is formed on the display panel and the bottom cover, and a fixing device having the same curvature as that of the bottom cover is coupled to the rear surface of the bottom cover.

However, since such a curved display device or curved display device is manufactured with a constant curvature, the user cannot arbitrarily change the curvature, and only the previously manufactured curvature has to be used. Due to this, there is a limitation that it could not be used by changing it to a flat surface or a curved surface depending on the content to be viewed.

In particular, since the size of the display panel is gradually increasing in recent years, it can be rather difficult to develop various and innovative display devices capable of changing the curvature along with the slimming demanded by consumers.

Therefore, there is a need for research to address these limitations and provide a curvature variable display device that can appeal to users with more versatility of use.

BRIEF SUMMARY OF THE DISCLOSURE

Embodiments of the present disclosure provide a display device in which a user can arbitrarily change the curvature into a flat display mode and a curved display mode.

Further, embodiments of the present disclosure provide a display device capable of accommodating various needs of a user by making a panel assembly slim while allowing a user to easily change a curvature regardless of the size of a large area display device.

The objects of the embodiments of the present disclosure are not limited to what have been described above, and those skilled in the art will clearly understand other objects not mentioned herein from the following description.

According to an aspect, embodiments of the present disclosure provide a curvature variable display device including a panel assembly including a display panel, a back plate disposed on a rear surface of the panel assembly, a first side bracket and a second side bracket respectively coupled to both sides of a rear surface of the back plate, a bending plate having one end rotatably coupled to the first side bracket and the other end rotatably coupled to the second side bracket and having a convex curvature toward a rear of the back plate, a stand post having an upper end coupled to a center of the bending plate and a lower end coupled to a stand base, and a dial assembly provided on the stand base to wind or unwind a wire coupled to a rear surface of the back plate and change curvatures of the panel assembly and the back plate.

The embodiments of the present disclosure provide a display device in which a user can arbitrarily change the curvature into a flat display mode and a curved display mode.

The embodiments of the present disclosure provide a display device capable of accommodating various needs of a user by making a panel assembly slim while allowing a user to easily change a curvature regardless of the size of a large area display device.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
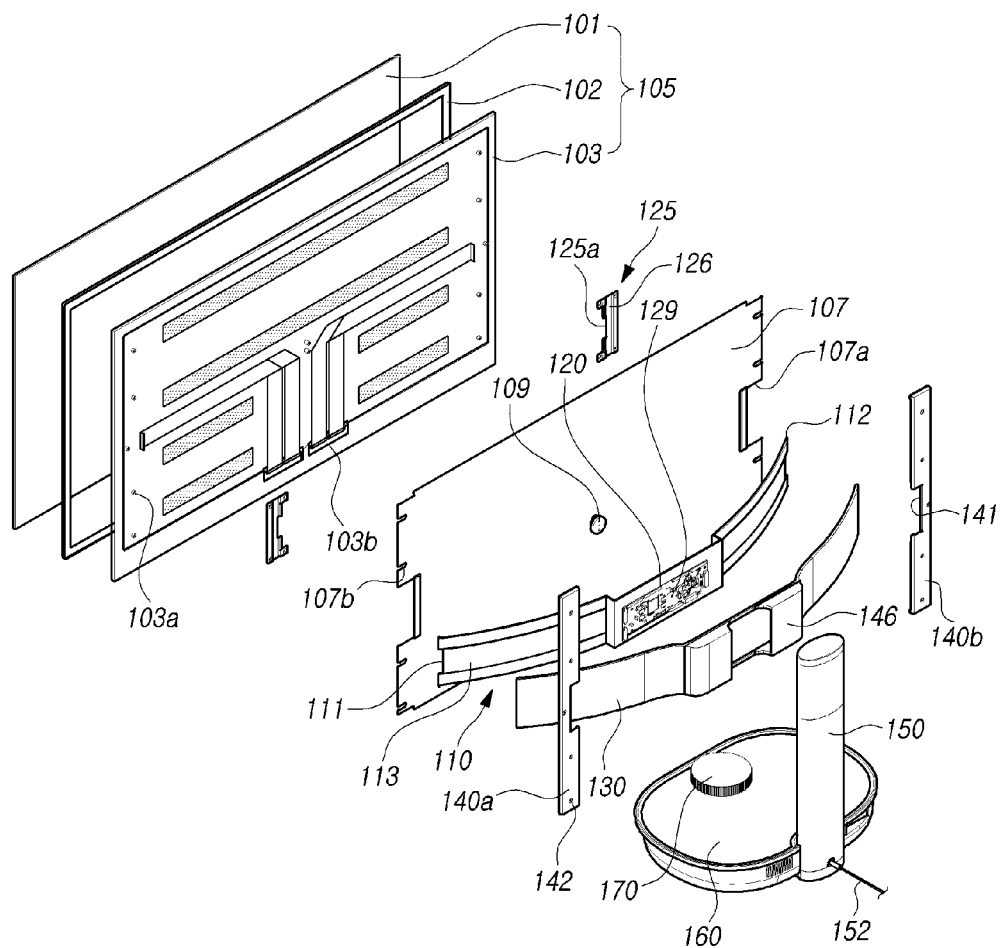
FIG. 1 is an exploded perspective view illustrating a curvature variable display device according to embodiments of the present disclosure.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description can make the subject matter in some embodiments of the present invention rather unclear. The terms such as "including", "having", "containing", "constituting", "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" can be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element can be included in at least one of two or more elements that "are connected or coupled to", "contact or overlap", etc. each other.

When time relative terms, such as "after", "subsequent to", "next", "before", and the like, are used to describe processes or operations of elements or configurations, or flows or steps in operating, processing, manufacturing methods, these terms can be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term "may" fully encompasses all the meanings of the term "can".

Figure 2:
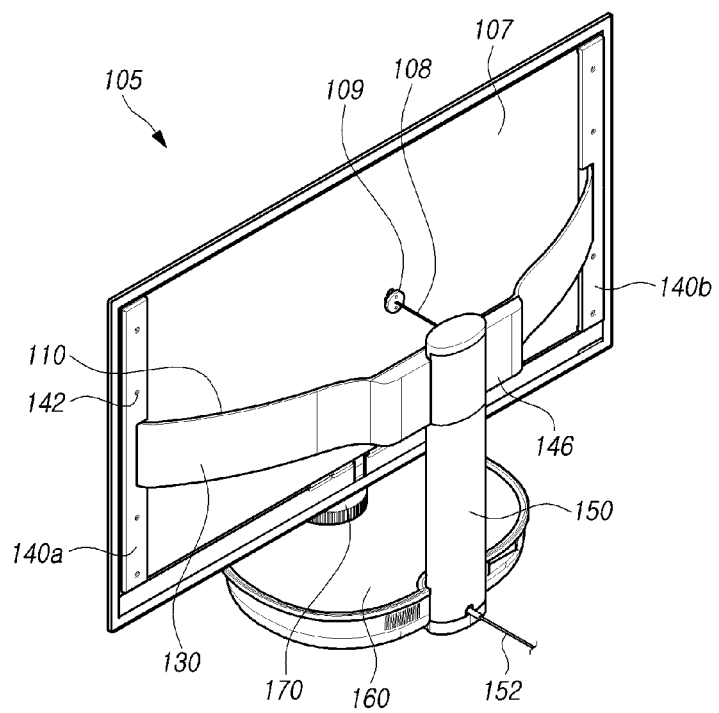
FIG. 2 is a perspective view illustrating the curvature variable display device according to embodiments of the present disclosure.
Figure 3:
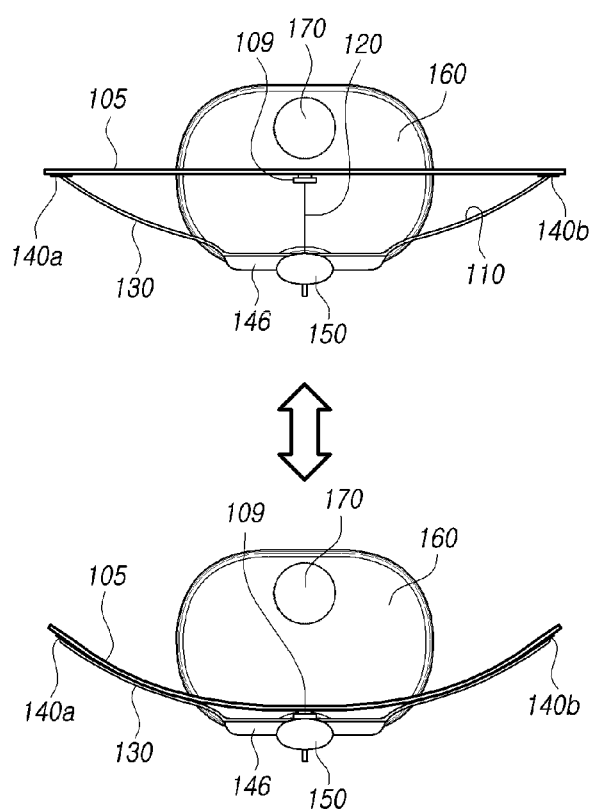
FIG. 3 is a plan view illustrating a state in which a curvature is changed in the curvature variable display device according to embodiments of the present disclosure.
Figure 10:
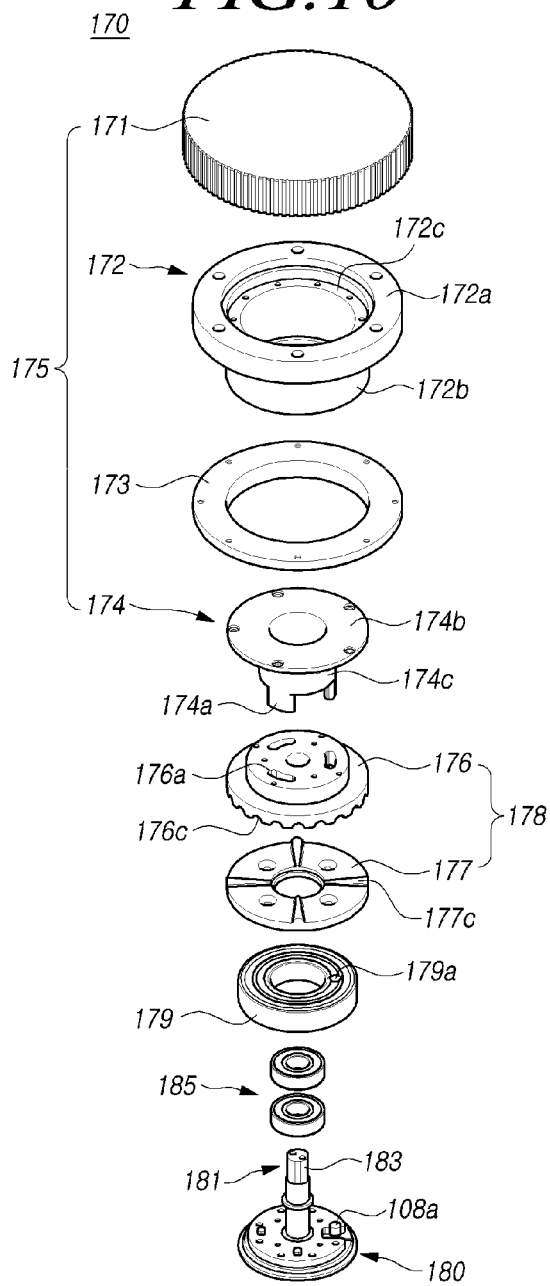
FIGS. 10 to 12 are exploded perspective views illustrating the curvature variable display device according to embodiments of the present disclosure.
Figure 11:
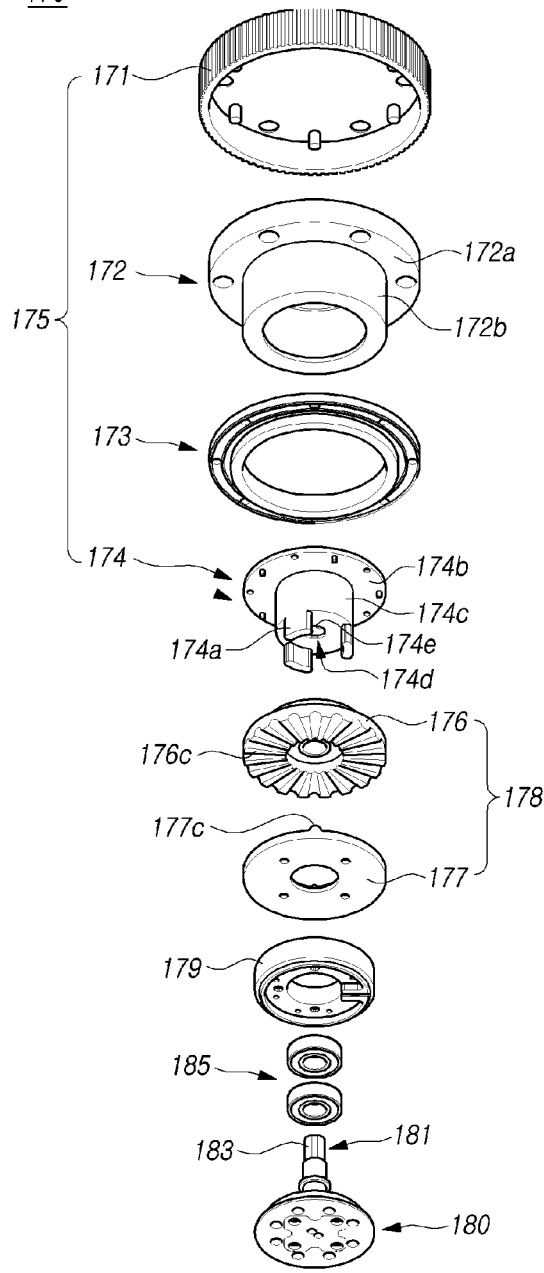
Figure 12:
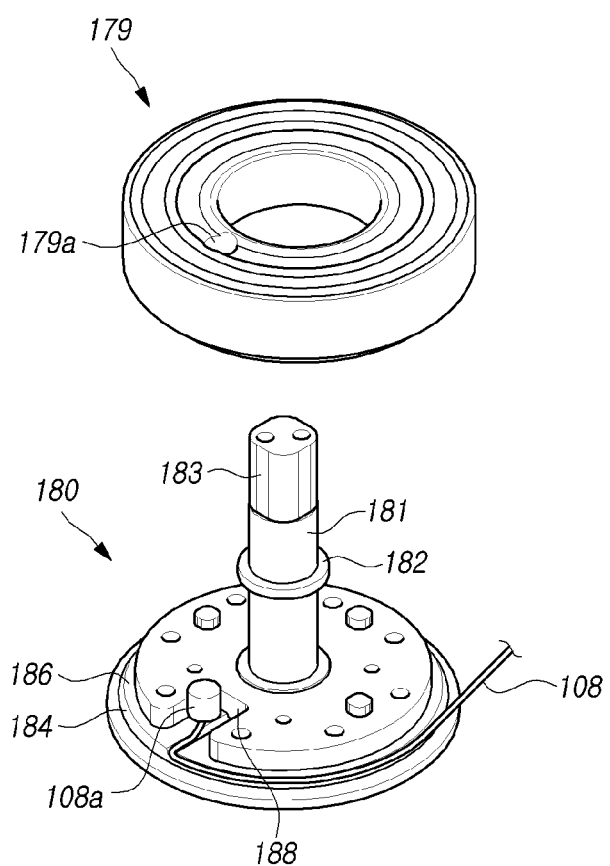
Figure 13:
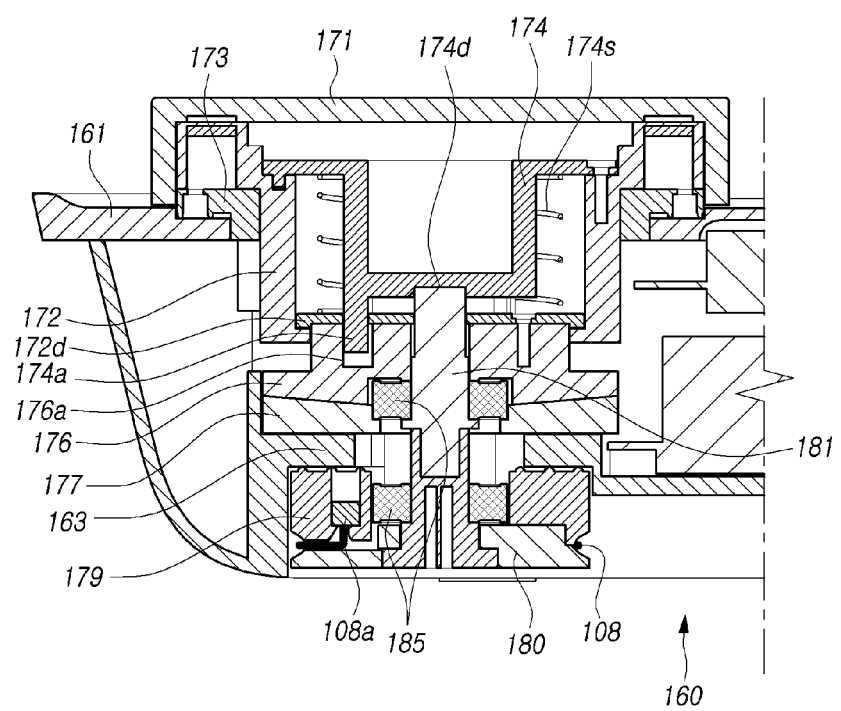
FIG. 13 is a sectional view illustrating the curvature variable display device according to embodiments of the present disclosure.
Figure 14:
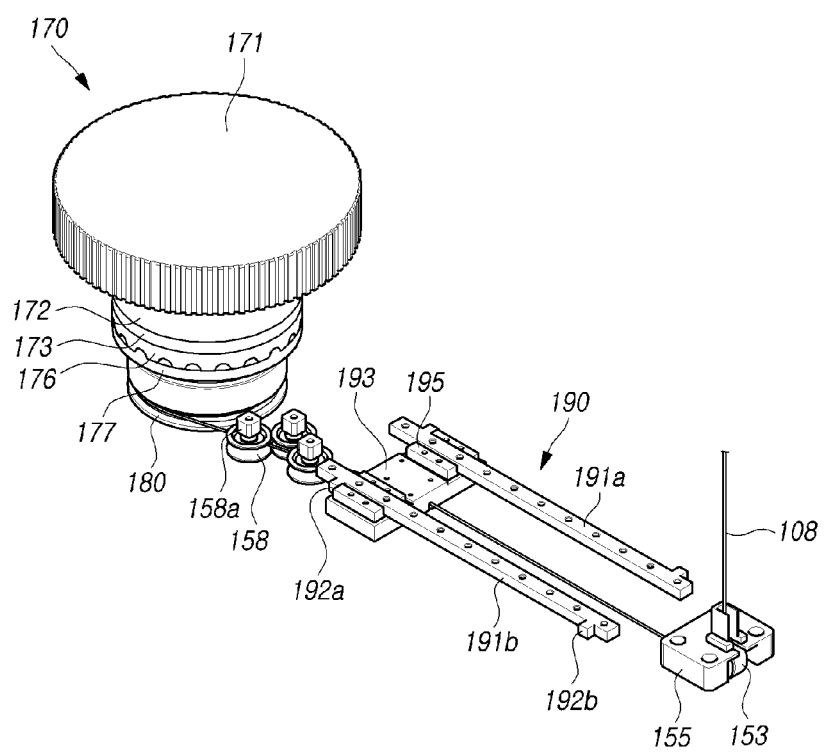
FIG. 14 is a perspective view illustrating the curvature variable display device according to embodiments of the present disclosure.
Figure 15:
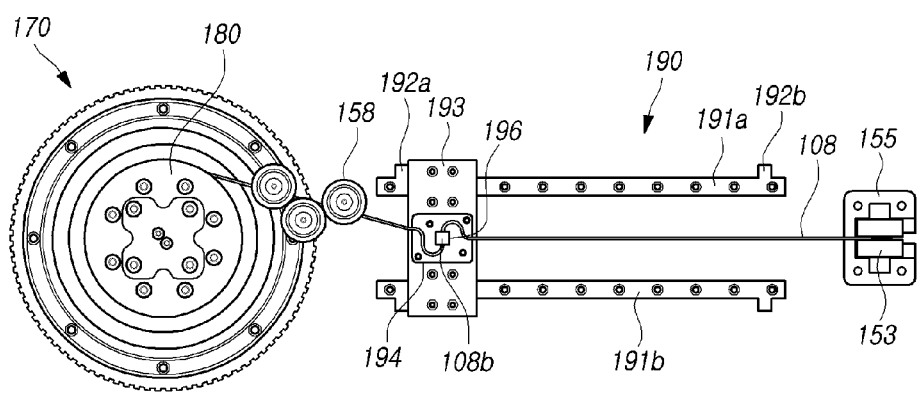
FIG. 15 is a rear view of FIG. 14.

FIG. 1 is an exploded perspective view illustrating a curvature variable display device according to embodiments of the present disclosure. FIG. 2 is a perspective view illustrating the curvature variable display device according to embodiments of the present disclosure. FIG. 3 is a plan view illustrating a state in which a curvature is changed in the curvature variable display device according to embodiments of the present disclosure. FIGS. 4 to 9 are perspective views illustrating the curvature variable display device according to embodiments of the present disclosure. FIGS. 10 to 12 are exploded perspective views illustrating the curvature variable display device according to embodiments of the present disclosure. FIG. 13 is a sectional view illustrating the curvature variable display device according to embodiments of the present disclosure. FIG. 14 is a perspective view illustrating the curvature variable display device according to embodiments of the present disclosure. FIG. 15 is a rear view of FIG. 14. All the components of each curvature variable display device according to all embodiments of the present disclosure are operatively coupled and configured.

As illustrated in FIGS. 1 to 15, the curvature variable display device according to embodiments of the present disclosure can include a panel assembly 105 including a display panel 101, a back plate 107 disposed on a rear surface of the panel assembly 105, a first side bracket 140a and a second side bracket 140b respectively coupled to both sides of a rear surface of the back plate 107, a bending plate 110 having one end rotatably coupled to the first side bracket 140a and the other end rotatably coupled to the second side bracket 140b and having a convex curvature toward a rear of the back plate 107, a stand post 150 having an upper end coupled to a center of the bending plate 110 and a lower end coupled to a stand base 160, and a dial assembly 170 provided on the stand base 160 to wind or unwind a wire 108 coupled to a rear surface of the back plate 107 and change curvatures of the panel assembly 105 and the back plate 107.

The curvature variable display device according to the embodiments of the present disclosure can implement both a flat display mode and a curved display mode according to a user's operation.

For example, the wire 108 coupled to the panel assembly 105 is coupled to the wire moving member 180 through the stand post 150, and both ends of the bending plate 110 in which the central portion is supported by the stand post 150 is rotatably coupled to the first side bracket 140a and the second side bracket 140b that support both sides of the panel assembly 105, so that the curvature of the panel assembly 105 is changed when the user operates the motor of the wire moving member 180 to move the wire 108.

In order to prevent the panel assembly 105 from being damaged or twisted when the curvature is changed, a back plate 107 is coupled to the rear surface of the panel assembly 105 to increase rigidity.

In the embodiments of the present disclosure, the display panel 101 can be applied irrespective of whether the display panel is a liquid crystal display panel or an organic light emitting display panel.

For example, when the display panel 101 is configured as an LCD panel, the panel assembly 105 can further include a backlight unit irradiating light onto the LCD panel, a lower polarization plate attached to a lower substrate, and an upper polarization plate attached to the front surface of an upper substrate. The specific configurations of the lower substrate and the upper substrate can be formed in various manners known to those skilled in the art according to, for example, twisted nematic (TN) mode, vertical alignment (VA) mode, in plane switching (IPS) mode, and fringe field switching (FFS) mode.

When the display panel 101 is configured as a light emitting display panel, the light emitting display panel can include a lower substrate in which a plurality of light emitting cells are formed in respective areas defined by gate lines, data lines, and power (VDD) lines, and an upper substrate face to face bonded to the lower substrate. This configuration is well known in the art to which the present disclosure is relevant, and thus related drawings and detailed description are not provided herein.

As such, the display panel 101 can be used irrespective of its type in embodiments of the present disclosure. Accordingly, the following description is given irrespective of the type of a display panel.

The bending plate 110 is formed in a curved surface having a convex curvature to the rear, and one end of the bending plate 110 is rotatably coupled to the first side bracket 140a and the other end is rotatably coupled to the second side bracket 140b.

Further, a wire fixing member 109 for fixing the end of the wire 108 is coupled to the rear center of the back plate 107, so that the curvature of the panel assembly 105 coupled to the back plate 107 is changed together when the wire 108 is pulled.

The panel assembly 105 includes a bottom cover 103 coupled to the rear surface of the display panel 101, a middle cabinet 102 coupled to edges of the display panel 101 and the bottom cover 103, and the like. The bottom cover 103 is provided with a pem nut 103a which is inserted into the fastening slits 107b formed at both ends of the back plate 107 and the insertion holes 142 formed in the first and second side brackets 140a and 140b, and is coupled with a fastening member.

In addition, magnets 104a and 104b are coupled between the rear surface of the bottom cover 103 and the front surface of the back plate 107, and the magnets 104a and 104b complement the rigidity of the bottom cover 103. Therefore, it is possible to minimize the pulling force of the wire 108 for changing the curvature by enabling a fine slip of the bottom cover 103 and the back plate 107 when the curvature is changed.

For example, in the case of a large-area display device, in the process of changing the curvature, a uniform frictional force is not generated in the entire area in which the bottom cover 103 and the back plate 107 contact each other, but a portion in which the frictional force is locally increased is generated. Accordingly, the pulling force of the wire 108 for changing the overall curvature is increased.

Therefore, coupling force is maintained by coupling the magnets 104a and 104b to a partial area between the bottom cover 103 and the back plate 107. And, it is possible to minimize the pulling force of the wire 108 for changing the overall curvature by accommodating the local slip between the bottom cover 103 and the back plate 107 to minimize the increase in the local friction force.

The magnets 104a and 104b can be provided at two or more places except for the area where the flexible circuit films 121a, 121b, and 123a, 123b are disposed. In the embodiments of the present disclosure, two are arranged on upper region of the flexible circuit film arranged on both sides, and two are respectively provided on one side and the other side of the vertically arranged flexible circuit film as an example.

Further, each of the first side bracket 140a and the second side bracket 140b is provided with a bracket cutout 141 through which the bending plate 110 passes, so that both ends of the bending plate 110 are rotatably supported when the curvature is changed. A hinge groove 143 into which the hinge portion 112 of the bending plate 110 is inserted and supported is provided in the upper and lower portions of the bracket cutout 141.

In addition, a plate cutout 107a is provided on both sides of the back plate 107 at positions corresponding to the bracket cutout 141. A hinge bracket 125 is coupled to the plate cutout 107a, and the hinge bracket 125 is provided with an end of the bending plate 110 and a receiving groove 126 in which the hinge portion 112 is accommodated.

Accordingly, the back plate 107 coupled to the hinge bracket 125 is supported by the hinge portion 112 of the bending plate 110 to be rotated when the curvature is changed.

Figure 4:
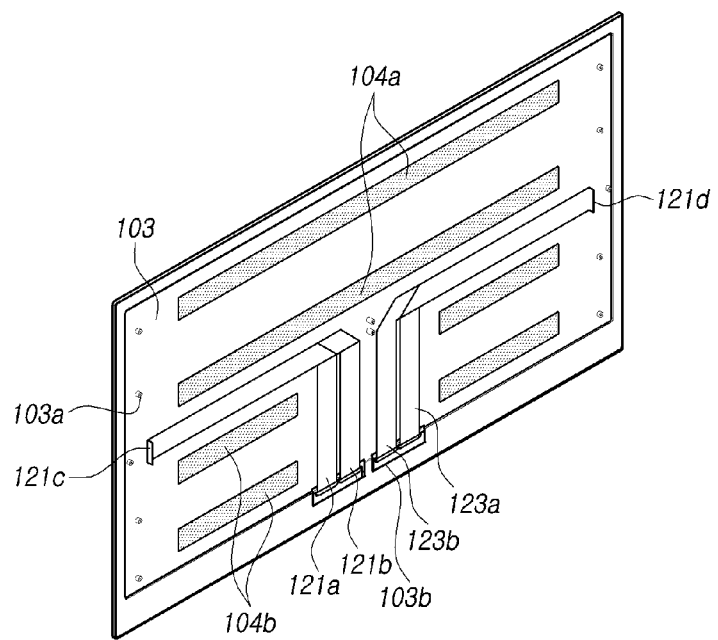
FIGS. 4 to 9 are perspective views illustrating the curvature variable display device according to embodiments of the present disclosure.
Figure 5:
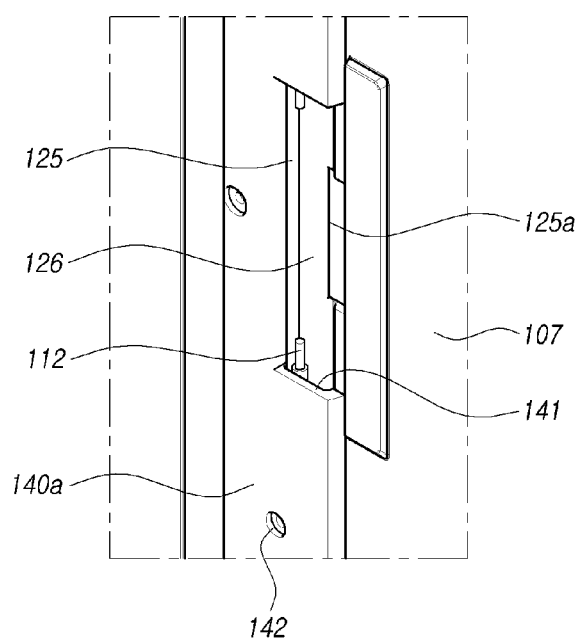
Figure 6:
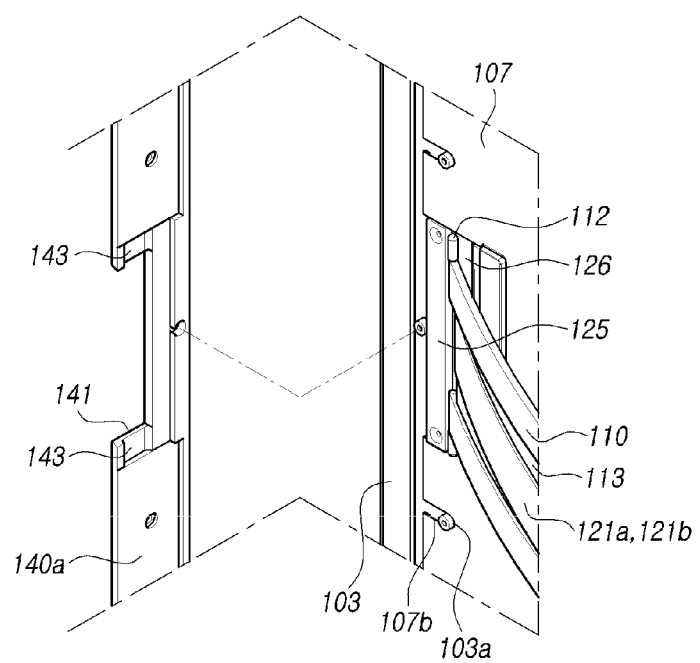
Figure 7:
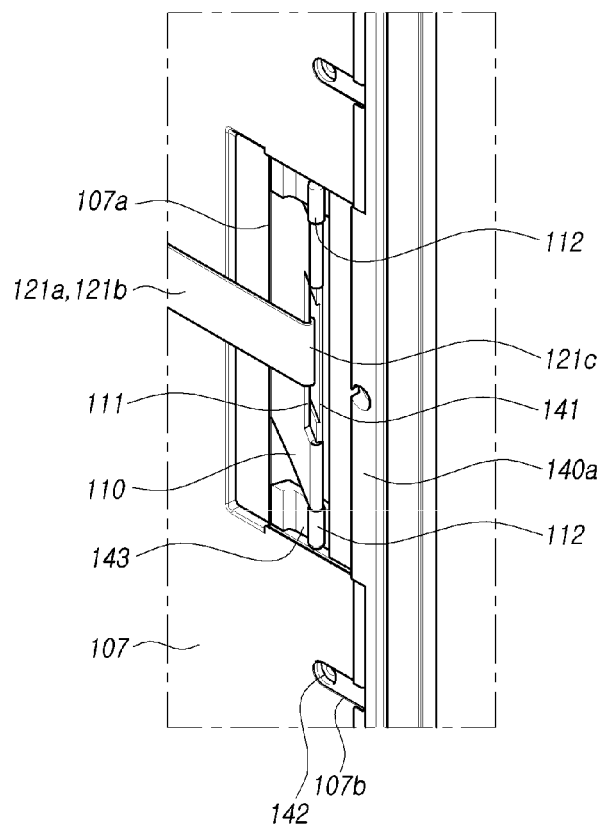
Figure 8:
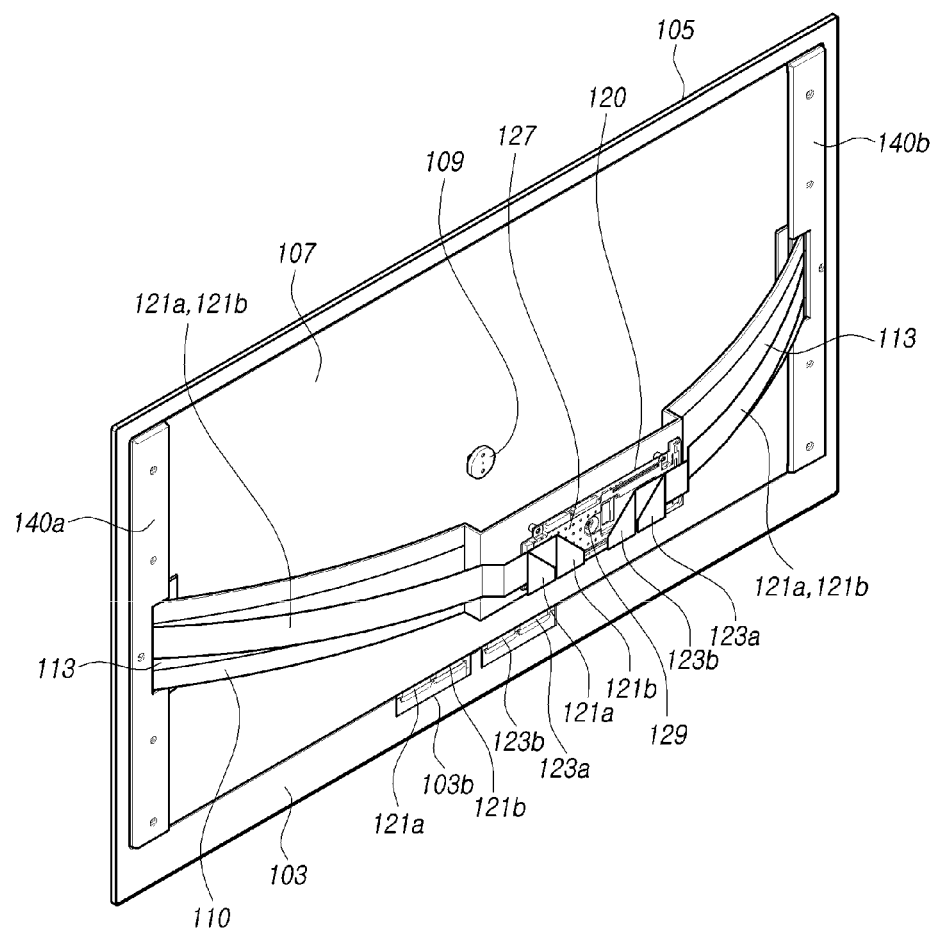
Figure 9:
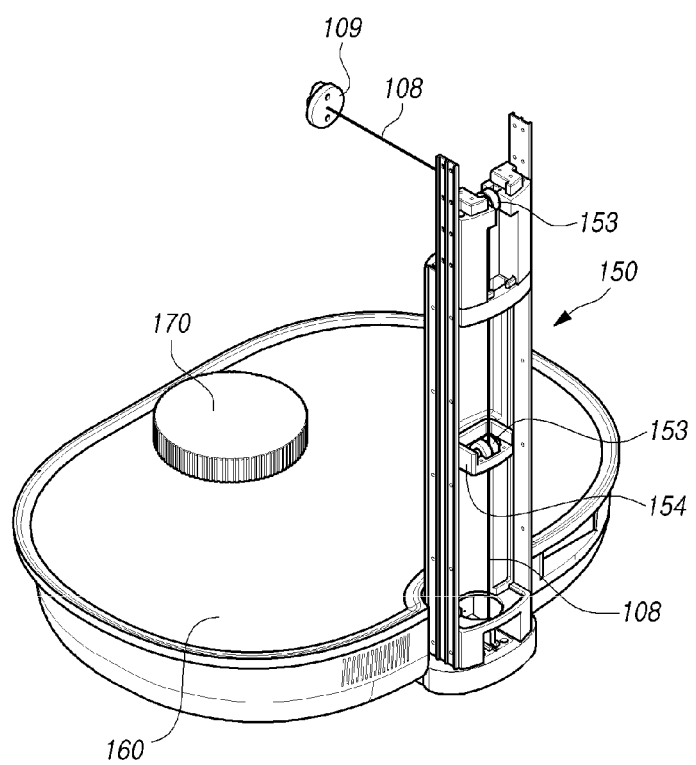

On the other hand, the end of the bending plate 110 is provided with a plate through hole 111, and the hinge bracket 125 is provided with a bracket through hole 125a at a position corresponding to the plate through hole 111, so that the outermost bending portions 121c and 121d on both sides of the flexible circuit films 121a, 121b, and 123a, 123b can pass through the plate through hole 111 and the bracket through hole 125a. In FIG. 4, for convenience of explanation, the flexible circuit films 121a, 121b, and 123a, 123b bent to the rear of the bending plate 110 is omitted and only the outermost bending portions 121c, 121d on both sides are shown.

For example, a film through hole 103b is provided in the bottom cover 103, so that the flexible circuit films 121a, 121b, and 123a, 123b connected to the source printed circuit board of the display panel 101 are disposed on the rear surface of the bottom cover 103. The flexible circuit films 121a, 121b, 123a, 123b passing through the film through hole 103b pass through the plate through hole 111 and the bracket through hole 125a and are disposed on the rear surface of the bending plate 110.

A control printed circuit board 120 connected the flexible circuit films 121a, 121b, 123a, 123b passing through the plate through hole 111 and the bracket through hole 125a is mounted on the rear surface of the central part of the bending plate 110, and a plate cover 130 is coupled to the rear of the bending plate 110.

The control printed circuit board 120 can be directly coupled to the rear surface of the bending plate 110 or coupled to a substrate bracket 127 coupled to the bending plate 110, in embodiments of the present disclosure, as an example, it is shown that the substrate bracket 127 is coupled to the rear surface of the central part of bending plate 110 and the control printed circuit board 120 is coupled to the substrate bracket 127.

The plate cover 130 is provided with a board receiving portion 146 in which the control printed circuit board 120 is accommodated, so that the plate cover 130 is coupled to surround the rear of the bending plate 110, the flexible circuit films 121a, 121b, 123a, 123b, the control printed circuit board 120 and the bending plate 110.

Further, the bending plate 110 is provided with stepped grooves 113 that accommodate flexible circuit films 121a, 121b, 123a, 123b so that it has its own space to accommodate flexible circuit films 121a, 121b, 123a, 123b in a state which the plate cover 130 is coupled to the bending plate 110.

Thus, it is possible to change the curvature of the panel assembly 105 and the back plate 107 in a slim appearance without external exposure of the flexible circuit films 121a, 121b, 123a, 123b and the control printed circuit board 120.

In addition, the bending plate 110 and the control printed circuit board 120 are provided with a wire through hole 129 through which the wire 108 coupled to the back plate 107 passes, so that the wire 108 connected to the center of the rear of the bending plate 110 can be disposed on the stand post 150 without interference.

One or more support rollers 153 supporting the wire 108 are rotatably coupled to the inside of the stand post 150 coupled to the center portion of the bending plate 110 and the plate cover 130, and an inner support portion 154 for rotatably supporting the support roller 153 is provided inside the stand post 150.

The dial assembly 170 operated when the user winds and unwinds the wire 108 includes a dial 175 protruding upward from the stand base 160, a wire pulley 180 which rotates in conjunction with the rotation of the dial 175 and winds or unwinds the wire 108, and a clutch 178 provided between the inner support portion 163 of the stand base 160 and the dial 175 to rotatably support the dial 175.

A pulley cap 179 having a fixing hole 179a is provided on the upper portion of the wire pulley 180 and a fixing end 108a provided at the end of the wire 108 is coupled to the fixing hole 179a. The pulley cap 179 is fixed to the inner support portion 163 of the stand base 160 so that the wire 108 is not separated when the wire pulley 180 is rotated.

The dial 175 includes a holding member 171 having a cylindrical shape with an open lower side, a dial body 172 having a large-diameter portion 172a and a cylinder portion 172b coupled to the holding member 171 on an upper side, and a stepped portion 172c provided inside a connection portion between the large-diameter portion 172a and the cylinder portion 172b, a damper 173 coupled to a lower portion of the large-diameter portion 172a of the dial body 172 and supported on an upper portion of the stand base 160, and a guide member 174 having a cylindrical body 174c inserted into the dial body 172 and having an enlarged diameter end 174b supported by the stepped portion 172c, and having a guide protrusion 174a extending from a lower end of the cylindrical body 174c.

Further, the clutch 178 includes a fixing member 177 fixed to the inner support portion 163 of the stand base 160 and having a fixing protrusion 177c on an upper side thereof and a rotating member 176 coupled to the dial 175 and the wire pulley 180 to rotate in interlocking manner and having a fixing groove 176c coupled to the fixing protrusion 177c of the fixing member 177 on a lower side thereof.

The holding member 171, the dial body 172 and the guide member 174 are interlocked and rotated in a state coupled to the rotating member 176, and the wire pulley 180 coupled to the rotating member 176 also rotates in conjunction with each other.

One or more fixing protrusions 177c formed on the fixing member 177 are radially elongated and spaced apart in the circumferential direction. The fixing grooves 176c formed in the rotating member 176 are shown as an example that a plurality of fixing grooves 176c are adjacent to each other in the circumferential direction, but the present disclosure is not limited thereto. The fixing groove 176c can be formed in the fixing member 177 so that the fixing protrusion 177c and the fixing groove 176c are coupled to each other, and also the fixing protrusion 177c can be formed in the rotating member 176.

The dial assembly 170 includes an elastic member 174s that elastically supports the rotating member 176 toward the fixing member 177 by having one end supporting the dial body 172 and the other end supporting the rotating member 176, and a support plate 172d can be provided between the dial body 172 and the rotating member 176.

The rotation member 176 is provided with a guide groove 176a into which the guide protrusion 174a of the guide member 174 is inserted, so that the vertical movement of the rotation member 176 and the support plate 172d is possible when the clutch 178 is operated.

For example, when the rotating member 176 is interlocked and rotates when the dial 175 is rotated, the fixing groove 176c is coupled and separated from the fixing protrusion 177c so that the rotating member 176 and the supporting plate 172d move up and down. At this time, the guide groove 176a of the rotating member 176 is vertically movable along the guide protrusion 174a.

Since the rotating member 176 is elastically supported toward the fixing member 177 by the elastic member 174s, in a state in which the fixing protrusion 177c is coupled to the fixing groove 176c, the vertical movement is limited by the elastic supporting force, and the rotation of the dial 175 is stopped.

Therefore, when the user turns the dial 175, the rotational movement and vertical movement of the rotating member 176 are made while the wire 108 is unwound or wound by the wire pulley 180 that rotates in conjunction with the dial body 172. The curvature of the panel assembly 105 is changed.

The wire pulley 180 is provided with a rotation shaft 181 disposed upward, and the guide member 174 is provided with an insertion groove 174d into which the rotation shaft 181 of the wire pulley 180 is inserted. And at least one shaft locking portion 183 is provided at the end of the rotating shaft 181, and the insertion groove 174d is provided with a groove locking portion 174e corresponding to the shaft locking portion 183 of the rotating shaft 181, so that the rotational force of the dial body 172 is transmitted to the rotation shaft 181.

The wire pulley 180 is rotatably supported by the fixing member 177 by a bearing 185 coupled to a bearing mounting portion 182 of the rotating shaft 181, and the wire pulley 180 is coupled to the rotating member 176 to enable vertical movement of the rotating member 176.

The lower end of the wire pulley 180 is provided with a support portion 186 on which the lower end of the pulley cap 179 is supported, and a wire mounting portion 184 on which the wire 108 is wound is formed on a lower portion of the support portion 186, and a wire passage 188 is formed for the fixing end of the wire 108 to be disposed on the fixing hole 179a of the pulley cap 179.

In addition, a wire guide member 190 disposed adjacent to the wire pulley 180 to guide the movement of the wire 108 is provided inside the stand base 160.

The wire guide member 190 includes a guide rail 191a, 191b fixed to the inner support portion 163 of the stand base 160, and a moving guide 193 to which the wire 108 is fixed and moving along the guide rail 191a, 191b.

The guide rails 191a, 191b can be provided as a pair disposed parallel to each other, and a upper side of the moving guide 193 is provided with a support portion 195 into which the guide rails 191a, 191b are inserted and slid, so that the support portion 195 of the moving guide 193 supports the guide rails 191a, 191b and slides when the wire 108 is wound and unwound.

Further, stoppers 192a, 192b are provided on one side and the other side of the guide rails 191a, 191b to stop while the support portion 195 of the moving guide 193 supports, respectively, so that the panel assembly 105 can be stopped in a flat state and a fully bent state.

For example, the first stopper 192a is provided at a position corresponding to the state in which the wire 108 is maximally wound and the panel assembly 105 is maximally bent, and the second stopper 192b is provided at a position corresponding to the state in which the wire 108 is maximally released and the panel assembly 105 is flat. Therefore it is possible to increase the convenience when the user operates the dial 175.

In addition, the lower side of the moving guide 193 is provided with a coupling groove 196 to which the fixed end 108b coupled to the wire 108 is coupled, so that the wire 108 is not separated when the moving guide 193 is moved.

Further, at least one support roller 158 is provided between the wire pulley 180 and the movement guide 193, and the support roller 158 is coupled to the inner support portion 163 of the stand base 160 via the coupling member 158a, so that when the user turns the dial 175, it is possible to support the wire 108 while changing the route of the wire 108 from the moving guide 193 to the wire pulley 180.

Furthermore, a main board and a power board connected to the control printed circuit board 120 are installed inside the stand base 160 to be connected to the power cable 152.

As described above, according to embodiments of the present disclosure, there can be provided a curvature variable display device in which a user can arbitrarily change the curvature into a flat display mode and a curved display mode.

Moreover, according to embodiments of the present disclosure, a curvature variable display device is provided, which is capable of accommodating various needs of a user by making a panel assembly slim while allowing a user to easily change a curvature regardless of the size of a large area display device.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present invention. The above description and the accompanying drawings provide an example of the technical idea of the present invention for illustrative purposes only.

For example, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. A curvature variable display device, comprising:
   a panel assembly including a display panel;
   a back plate provided on a rear surface of the panel assembly;
   a first side bracket and a second side bracket respectively coupled to two sides of a rear surface of the back plate;
   a bending plate having one end rotatably coupled to the first side bracket and another end rotatably coupled to the second side bracket, and having a convex curvature toward a rear of the back plate;
   a stand post having an upper end coupled to a center area of the bending plate and a lower end coupled to a stand base; and
   a dial assembly provided on the stand base to wind or unwind a wire coupled to the rear surface of the back plate and change curvatures of the panel assembly and the back plate.

2. The curvature variable display device according to claim 1, wherein the panel assembly comprises a bottom cover coupled to a rear surface of the display panel, and
   a magnet is coupled between the bottom cover and the back plate.

3. The curvature variable display device according to claim 1, wherein a bracket cutout through which the bending plate passes is provided in each of the first side bracket and the second side bracket, and
   hinge grooves in which a hinge portion of the bending plate is inserted and supported are provided at upper and lower portions of the bracket cutout.

4. The curvature variable display device according to claim 3, wherein a plate cutout is provided on both sides of the back plate at positions corresponding to the bracket cutouts,
   a hinge bracket having a receiving groove is coupled to the plate cutout, and
   an end of the bending plate and a hinge portion are accommodated in the receiving groove of the hinge bracket.

5. The curvature variable display device according to claim 4, wherein a plate through hole is provided at an end of the bending plate,
   a bracket through hole is provided in a position corresponding to the plate through hole in the hinge bracket, and
   a flexible circuit film connected to a source printed circuit board of the display panel is disposed on a rear surface of the bending plate through the plate through hole and the bracket through hole.

6. The curvature variable display device according to claim 1, wherein one or more support rollers configured to support the wire are rotatably coupled to inside of the stand post.

7. The curvature variable display device according to claim 1, wherein the dial assembly comprises:
   a dial protruding upward from the stand base;
   a wire pulley configured to rotate in conjunction with a rotation of the dial, and wind or unwind the wire; and
   a clutch provided between an inner support portion of the stand base and the dial to rotatably support the dial.

8. The curvature variable display device according to claim 7, wherein a pulley cap having a fixing hole to which a fixing end provided at an end of the wire is coupled is provided on an upper portion of the wire pulley, and
   the pulley cap is fixed to the inner support portion of the stand base.

9. The curvature variable display device according to claim 7, wherein the dial comprises:
   a holding member having a cylindrical shape with an open lower side;
   a dial body having a large-diameter portion and a cylinder portion coupled to the holding member on an upper side, and a stepped portion provided inside a connection portion between the large-diameter portion and the cylinder portion;
   a damper coupled to a lower portion of the large-diameter portion of the dial body and supported on an upper portion of the stand base; and
   a guide member having a cylindrical body inserted into the dial body and having an enlarged diameter end supported by the stepped portion of the dial body, the guide member having a guide protrusion extending from a lower end of the cylindrical body of the guide member.

10. The curvature variable display device according to claim 9, wherein the clutch comprises:
    a fixing member fixed to the inner support portion of the stand base and having a fixing protrusion on an upper side thereof; and
    a rotating member coupled to the dial and the wire pulley to rotate in an interlocking manner, and having a fixing groove coupled to the fixing protrusion of the fixing member on a lower side thereof.

11. The curvature variable display device according to claim 10, wherein one or more of the fixing protrusion of the fixing member is radially arranged and provided in a circumferential direction, and
    at least one fixing groove is provided adjacent to each other in the circumferential direction.

12. The curvature variable display device according to claim 11, wherein the dial assembly further comprises an elastic member having one end supporting the dial body and another end supporting the rotating member to elastically support the rotating member toward the fixing member.

13. The curvature variable display device according to claim 12, wherein the rotating member is provided with a guide groove, and the guide protrusion of the guide member is inserted into the guide groove of the rotating member.

14. The curvature variable display device according to claim 13, wherein the wire pulley is provided with a rotation shaft disposed upward, and the guide member is provided with an insertion groove into which the rotation shaft is inserted.

15. The curvature variable display device according to claim 14, wherein at least one shaft locking portion is provided at an end of the rotation shaft, and a groove locking portion corresponding to the shaft locking portion is provided in the insertion groove of the guide member.

16. The curvature variable display device according to claim 7, wherein a wire guide member disposed adjacent to the wire pulley to guide a movement of the wire is provided inside the stand base.

17. The curvature variable display device according to claim 16, wherein the wire guide member comprises:

a guide rail fixed to the inner support portion of the stand base; and a moving guide to which the wire is fixed and moving along the guide rail.

18. The curvature variable display device according to claim 17, wherein a support portion is provided on an upper side of the moving guide, and the guide rail is inserted into the support portion to be supported and slid.

19. The curvature variable display device according to claim 18, wherein a coupling groove is provided at a lower side of the movement guide, and a fixed end of the wire is coupled thereto.

20. The curvature variable display device according to claim 19, wherein at least one support roller is provided between the wire pulley and the moving guide, which is coupled to the inner support portion of the stand base to support the wire.

* * * * *